US 6,717,853 B2

(12) United States Patent
Abedifard et al.

(10) Patent No.: US 6,717,853 B2
(45) Date of Patent: Apr. 6, 2004

(54) FLASH MEMORY DEVICE WITH DISTRIBUTED COUPLING BETWEEN ARRAY GROUND AND SUBSTRATE

(75) Inventors: Ebrahim Abedifard, Sunnyvale, CA (US); Fariborz Frankie Roohparvar, Monte Sereno, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/225,130

(22) Filed: Aug. 22, 2002

(65) Prior Publication Data

US 2004/0037115 A1 Feb. 26, 2004

(51) Int. Cl.$^7$ .............................................. G11C 16/04
(52) U.S. Cl. ......................... 365/185.16; 365/185.05; 365/185.27; 365/185.18; 365/185.33
(58) Field of Search ....................... 365/185.16, 185.05, 365/185.27, 185.18, 185.33

(56) References Cited

U.S. PATENT DOCUMENTS 5,646,886 A * 7/1997 Brahmbhatt ........... 365/185.16

* cited by examiner

Primary Examiner—David Lam
(74) Attorney, Agent, or Firm—Dickstein Shapiro Morin & Oshinsky LLP

(57) ABSTRACT

A flash memory device is disclosed in which includes a plurality of flash memory transistors disposed within a doped well. The transistors are coupled at respective sources to an array ground node via a plurality of array ground lines. A plurality of switching devices distributed throughout the doped well switchingly couple the array ground lines to the doped well to reduce an elevated voltage otherwise present on the array ground lines when the array ground lines are heavily loaded.

19 Claims, 8 Drawing Sheets

FLASH MEMORY DEVICE WITH DISTRIBUTED COUPLING BETWEEN ARRAY GROUND AND SUBSTRATE

FIELD OF THE INVENTION

The present invention relates to a method and apparatus for operating a flash memory cell.

BACKGROUND OF THE INVENTION

Flash memory is a variety of electronic memory in which a specialized field effect transistor is used to store a data value. A binary data value is represented by programming the transistor to have one of two threshold voltage values. Like EEPROM, the threshold voltage value of a Flash memory transistor is programmable by storing and releasing charge on a floating gate structure within the transistor. Unlike EEPROM Flash memory includes a mechanism by which a large number of memory cells may be erased simultaneously. Also, the tunnel oxide layer between a floating gate and a channel region of a Flash memory cell transistor is typically thinner and more uniform than the corresponding oxide layer between the floating gate and channel region of an EEPROM memory cell transistor.

The foregoing will be more fully explained with reference to FIG. 1 which illustrates a structure of an n-channel flash memory transistor 100 including a source 102 of n-doped semiconductor material, a drain 104 of n-doped semiconductor material, a first insulating layer 106, a floating gate structure 108, a second insulating layer 110, and a control gate structure 112. The first and second insulating layers are formed of, for example, silicon dioxide. The floating gate and control gate structures are formed of, for example, poly-crystalline silicon (poly).

The transistor 100 is formed in a doped region 114 (e.g., a p-well) of a substrate 116. The p-well includes a channel region 118 under the first insulating layer 106. The substrate 116 includes a semiconductor material such as single-crystal silicon. The p-well 114 is bounded at a lower boundary by an implanted region of n-type material 120, and at a perimeter 122 by a trench of diffusion-doped n-type material 124.

The transistor 100 is programmed into a particular state by varying an amount of charge stored on the floating gate structure 108. The state of the transistor is then read by applying a voltage between the drain 104 and source 102 of the transistor and sensing a resulting magnitude of current through the transistor.

In one exemplary flash memory transistor, the floating gate 108 is made of conductive (doped semiconductor) material but is not directly connected to an external source of charge. Charge is added to and removed from the floating gate by injection and tunelling across the first insulating layer 106. Various mechanisms for charge transfer are known in the art. For example, charge may be added to the floating gate 108 by Channel Hot Electron Injection, and removed from the floating gate 108 by Fowler-Nordheim tunnelling.

In Channel Hot Electron Injection, electrons are accellerated to high velocities by high strength electric fields. These "ballistic" electrons are then propelled by the high fields from the source 102 into the insulating material 106. A certain proportion of the ballistic electrons traverse the insulator 106 without scattering, and are captured in the floating gate 108 material on the other side. These captured electrons act to increase the quantity of charge on the floating gate 108.

Fowler-Nodheim (F-N) tunneling depends on the fact that, per quantum mechanics, there is a finite probability that a particle will traverse an energy barrier of finite height, despite the fact that the energy of the particle is insufficient to surmount the energy barrier. Once an electron tunnels from the floating gate 108 into the first insulating layer 106, it can move freely in the valence or conduction band of the insulator 106 and may thus traverse the insulator. As electrons tunnel out of the floating gate 108, the charge on the floating gate diminishes. The currents resulting from both Hot Electron Injection and F-N tunneling depend on the respective potentials of the flash transistor source 102, drain 104, and control gate 112.

A first quantity of charge is introduced onto the floating gate structure 108 during an erase operation. To cause this transfer of charge to the floating gate 108, the source 102 and p-well 114 of the transistor 100 are raised to a high potential such as approximately 9V. This erases the transistor 100 and establishes a first state of the transistor (e.g. a logical zero state). Thereafter, if it is desired to program the transistor to represent a logical one state, the quantity of charge present on the floating gate structure 108 is modified. This is done by applying a potential within a particular range of potentials between the control gate structure and the source and drain of the transistor. Consequently, some electrons tunnel out of the floating gate 108, across the insulator 106, and a second quantity of charge is left on the floating gate structure 108.

The quantity of charge on the floating gate affects the operation of the transistor. Depending on the characteristics of the transistor, the charge on the floating gate may supplement or oppose the effect of a sensing voltage applied to the control gate. For example, in an enhancement mode n-mos transistor, the presence of charges (electrons) on the floating gate attracts holes into the channel region of the transistor and increases its conductivity. Thus, a transistor with a highly charged floating gate exhibits a lower turn-on threshold voltage (Vth) than the same transistor with its floating gate relatively discharged.

Alternately, depending on transistor polarity, the charge stored on the floating gate structure shields the channel region below that gate from the fields of charges introduced into the control gate, and inhibits the accumulation of free carriers within the channel region. Therefore, the threshold voltage of the transistor is again modified by the presence of charge on floating gate.

When exemplary transistor 100 is in an erased state (e.g. programmed to represent a logical zero) the threshold voltage of the transistor is relatively low, and the channel 118 becomes conductive when a sensing voltage is applied to the control gate 112 of the transistor. Conversely, when transistor 100 is programmed to a logical one and a sensing voltage is applied to the control gate 112 of the transistor, the channel 118 remains non-conductive. Thus, substantially no current flows through the transistor between the column line and the array ground node in response to an applied source-drain voltage.

As shown in FIG. 2 a flash memory device 200 includes a plurality of memory transistors 100 arranged in a two-dimensional array 202. Along a first dimension of the two dimensional array, the transistors 100 form rows as shown by 204.

Along a second dimension of the two dimensional array, the transistors 100 form columns as shown by 206. The device includes a plurality of conductive traces (row lines) 208 (otherwise denominated word lines) disposed along the rows respectively. Each row line 208 is coupled to the respective control gates 112 of the transistors 100 of the respective row 204. Thus the control gate 112 of every transistor of a row quickly assumes an electrical potential (i.e., a sensing voltage) impressed on the respective row line 208 of the row.

The device 200 also includes a plurality of column lines 210 (otherwise denominated bit lines) disposed along respective columns 206 of transistors 100. Each column line is coupled to the respective drain 104 of the transistors 100 of a respective column.

The source of every transistor is coupled to an electrical node designated array ground 212 through a plurality of array ground lines 214. As will be discussed further below, the array ground node is switchingly connectable, by means of a switching device 216, to a source of reference potential (e.g. ground potential) 218.

As seen in FIG. 2, the array 202 of memory cell transistors 100 is disposed in P-well 114, the perimeter of which is bounded by N-well 124. The device 200, including the n-well, is disposed in p-type substrate 116. A plurality of sense amplifiers 220, each having an input 222 coupled to a respective one of the plurality of column lines 210 are disposed in the p-type substrate outside of the p-well 114.

An erase potential switching device 234 switchingly couples a source of an erase voltage VErs 236 to the p-well 114. A further switching device (transistor) 235 is disposed to switchingly couple a source of the erase potential switching device to the plurality of array ground lines 214. When activated by a signal at an input 238, the switching device acts to raise the potential of the p-well 114 to VErs (e.g., 9V) as part of the device erasure cycle. Concurrently, the switching device 235 becomes conductive, coupling the array ground lines 214 to the source of erase voltage VErs through the erase potential switching device 234. Subsequent to device erasure, the erase potential switching device 234 becomes non-conductive, and a grounding switching circuit 240 switchingly couples the p-well 114 to a source of ground potential 218.

The circuit of FIG. 2 functions as a wired-or device. During a read cycle, a potential (e.g., Vcol) 232 is applied to each of the column lines 210 through a pull-up resistor 230. Also during the read cycle, one of the plurality of rows is selected based on an output received from a conventional row decoder. Consequently, the row line (word line) 208 of the selected row is raised from a first low potential (e.g. ground) to a sensing voltage. The sensing voltage lies between the threshold voltage of an erased cell and the threshold voltage of a programmed cell. The sensing voltage is transferred to the respective control gate 112 of each transistor 100 of the row 204. If the sensing voltage is above the threshold voltage for a particular transistor, as programmed, the transistor will become conductive. Otherwise, the transistor will be non-conductive. Thus, depending on the programmed state (erased/programmed) of each transistor of the row, that transistor may or may not short the column line 210 to which it is connected to the array ground line 214. If the transistor becomes conductive when the sensing voltage is applied, it causes the column line 210 to which the transistor 100 is coupled to drop to the potential of the array ground line 214. Otherwise, the column line remains at approximately Vcol 232. In either case, the voltage of the column line is sensed by a sensing circuit 220 and output to an output line 221. The outputs of the sensing circuits, taken together, form an output word corresponding to the data values stored in the selected row of the flash memory device.

Depending on the number of erased and programmed memory cells in an output word, the current delivered to the array ground line 214 by the flash memory transistors 100 may be large or small. In the extreme case where every memory cell of the row has been programmed to a 1 state, all transistors remain non-conductive when the sensing voltage is applied to the respective control gates 112 of the transistors 100. Thus, essentially no current is conducted to the array ground line. At the other extreme, when every memory cell of the row remains in its erased state, a maximum (worst case) current is delivered to the array ground line.

As previously noted, the array ground line is coupled to ground through a switching device such as a transistor 216. This is necessary so that the array ground may be decoupled from ground potential during an erase cycle. In order to conduct the worst case array ground current without unduly raising the voltage of the array ground line, the transistor 216 and array ground traces 214 must be made large. If the transistor 216 and array ground lines 214 are not sufficiently conductive, and the voltage on the array ground line 214 rises, then the voltage differential across the source and drain of the flash memory transistors is reduced.

In practice during a read cycle, conventional array ground lines may experience a voltage rise (and hence a reduction in source-drain voltage). Because the column lines 210 are capacitive, this reduction in source-drain voltage increases the time required for the column lines to discharge to a stable output potential. In other words, device operation is slower under worst case conditions, as described.

If device operation is slowed, the device may miss a timing window i.e. not reach a stable voltage before an output state of the device is read by a further system to which the Flash memory device is coupled. In such a case, a spurious value may be transferred to the further system.

Also, threshold voltage Vth of the flash memory transistor 100 is referenced to the source 102 of the transistor 100, which is coupled to the array ground line 214. The sensing voltage (applied to the control gate 112 via the row line 208), however, is referenced to the p-well 114. Thus as the array ground line 214 voltage rises with respect to the p-well 114, the apparent voltage applied to the control gate 112 is reduced. The conductivity of the flash memory transistor 110 may diminish responsively, further slowing device response. Moreover, if the array ground line voltage is driven up far enough, an erased transistor would be shut off entirely, again resulting in spurious data output.

Accordingly, it is desirable to have a flash memory device adapted to rapidly and reliably output data in response to a read command even when a large proportion of the transistors of a row being read are programmed to a conductive state.

BRIEF SUMMARY OF THE INVENTION

The invention provides a distributed switchable coupling (typically a transistor) between the array ground line and the p-well. This coupling prevents the electrical potential of the array ground line from rising far above the electrical potential of the p-well. In one aspect of the invention, a distributed transistor is disposed within the p-well having a first (drain) terminal coupled to the array ground line and a second (source) terminal coupled to the p-well. In another aspect of the invention, a plurality of transistors distributed throughout the p-well and adapted to switchingly couple the array ground node to the p-well in which the array of flash memory transistors is disposed. The p-well is adapted to be switchingly coupled to a source of high voltage during an erase cycle and otherwise to a source of ground potential.

The method and apparatus of the invention can be applied to a flash memory device having plural banks of memory arrays, each bank having a respective plurality of array ground lines, each array ground line having a respective plurality of coupling transistors.

These and other advantages and features of the invention will be more clearly understood from the following detailed description of the invention which is provided in connection with the accompanying drawings.

DETAILED DESCRIPTION OF THE INVENTION

Figure 3:
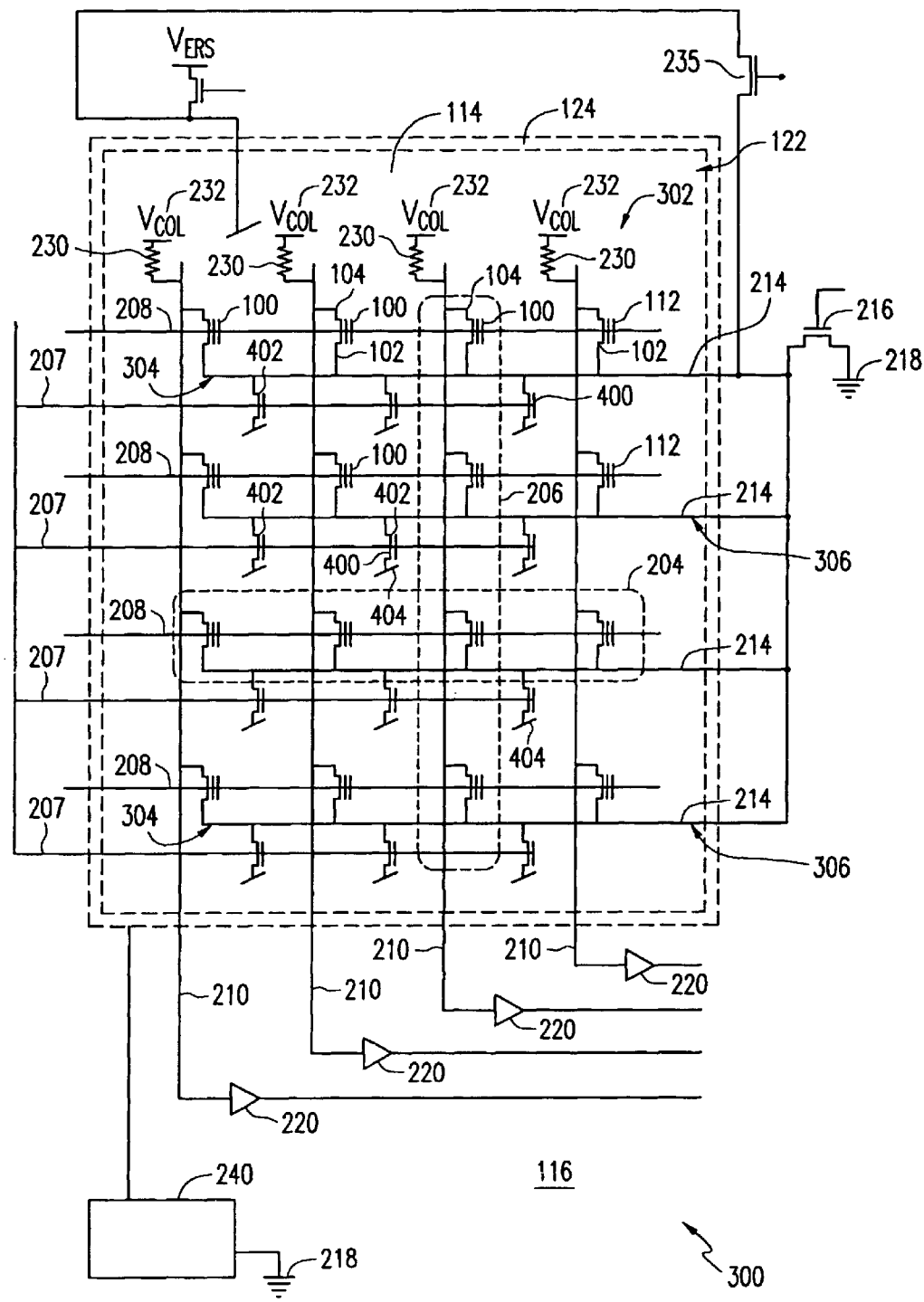
FIG. 3 shows an electrical schematic diagram of a portion of a flash memory device according to one aspect of the invention.

FIG. 3 shows a flash memory device 300 according to one embodiment of the invention. The device includes a plurality of flash memory transistors 100 disposed in a two-dimensional array 302 within a p-well 114. The p-well is bounded by a region of n-doped semiconductor 124 which, in turn, lies within a p-type semiconductor substrate 116. In conventional fashion, each flash memory transistor 100 has a drain 104 coupled to one of a plurality of column lines 210 and a source 102 coupled to one of a plurality of array ground lines 214. A control gate 112 of each flash memory transistor 100 is coupled to one of a plurality of row lines 208.

The flash memory device 300 includes a mechanism for switchingly electrically coupling the array ground lines 214 to the p-well 114. In FIG. 3 this mechanism includes a plurality of switching devices 400 disposed in distributed fashion within the p-well 114. The plurality of switching devices 400 includes a plurality of conventional n-mos coupling transistors. Each n-mos coupling transistor of the plurality includes a drain terminal 402 coupled to a respective one of the plurality array ground lines 214 and a source terminal 404 coupled to the p-well 114.

One or more switching devices 400 may be coupled to each of the array ground lines 214. The plurality of switching devices may be uniformly distributed in relation to the two dimensional region defined by the perimeter 122 of the p-well 114, or may be spatially concentrated as necessary.

For example, in one aspect of the invention, a relatively high density of switching devices is provided coupled to said array ground lines 214 at respective distal ends 304 of the array ground lines viewed with respect to the array ground transistor 216, whereas a relatively low density of switching devices is provided coupled to the corresponding proximal ends 306 of the array ground lines.

Figure 4:
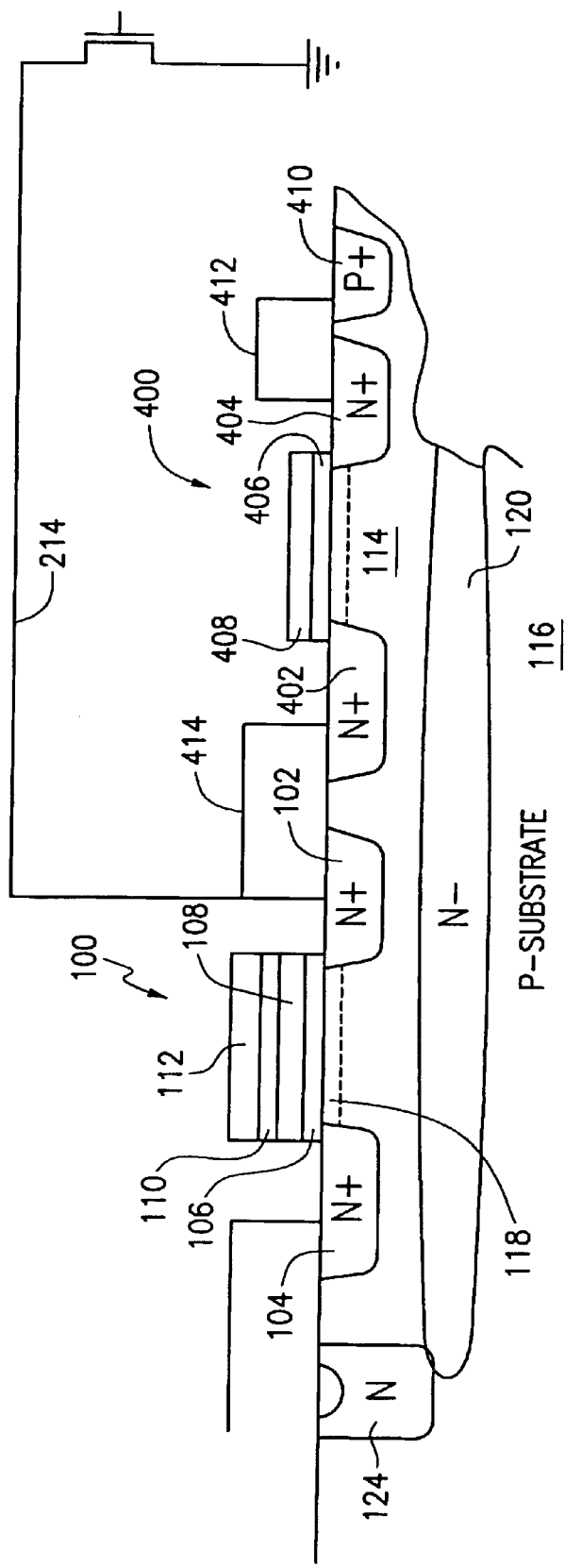
FIG. 4 shows a substrate cross-sectional view of the structure of a coupling transistor according to one aspect of the invention.

In a further aspect of the invention, in which the switching devices 400 are n-mos coupling transistors, relatively fewer coupling transistors are provided, but with wider gate dimensions to enable correspondingly higher current carrying capacity. In this aspect of the invention, the transistors are coupled to respective array ground lines with respective metallic coupling lines 414 such as shown in FIG. 4.

Referring again to FIG. 3, during operation of the flash memory device, an erase cycle, a write cycle and a read cycle, are performed. During the erase cycle, a signal at a gate of array ground transistor 216 causes transistor 216 to become non-conductive. Also, a signal on the array ground gate line 207 causes the plurality of switching devices 400 to become non-conductive. The array ground lines 214 are thus switchingly decoupled from both ground potential 218 and the p-well 114. The memory cell transistors 100 of the array 302 are then erased by an application of conventional electrical potentials to the respective sources 102, drains 104, control gates 112 and substrates 114 of the flash memory transistors 100.

After the erase cycle, the flash memory transistors 100 may be optionally and selectively be programmed in conventional fashion by an application of conventional programming voltages to the respective sources 102, drains 104, control gates 112 and substrates 114 of the flash memory transistors 100. During the programming cycle, the distributed switching devices 400 typically remain non-conductive.

During a read cycle, a signal is applied to the gate of the array ground transistor and a signal is applied to the gates 408 of the switching devices (coupling transistors) 400, causing the array ground and coupling transistors to become conductive. Also, the grounding switching circuit 240 is signaled to connect the p-well 114 to ground potential 218.

Accordingly, the array ground lines 208 are switchingly coupled to a source of ground potential 218 through the array ground transistor 216. Concurrently, the array ground lines 208 are connected to the p-well 114 through the distributed coupling transistors 400, and the p-well is connected to ground potential 218 through the grounding switching circuit 240.

One of the row lines 214 is selected by a conventional row decoder and a sensing voltage is applied to the row line 216. A column line voltage 232 is applied to the column lines 210 through respective pull-up transistors 230, and the respective sense amplifiers 220 sense the resulting voltages on the column lines 210 respectively, as disclosed above.

Even under worst case conditions, when array ground lines 214 are high, the additional route to ground 218 supplied by the semiconducting p-well 114 and the grounding switching circuit 240 acts to maintain the electrical potential of the array ground lines 214 near ground potential 218.

Figure 2:
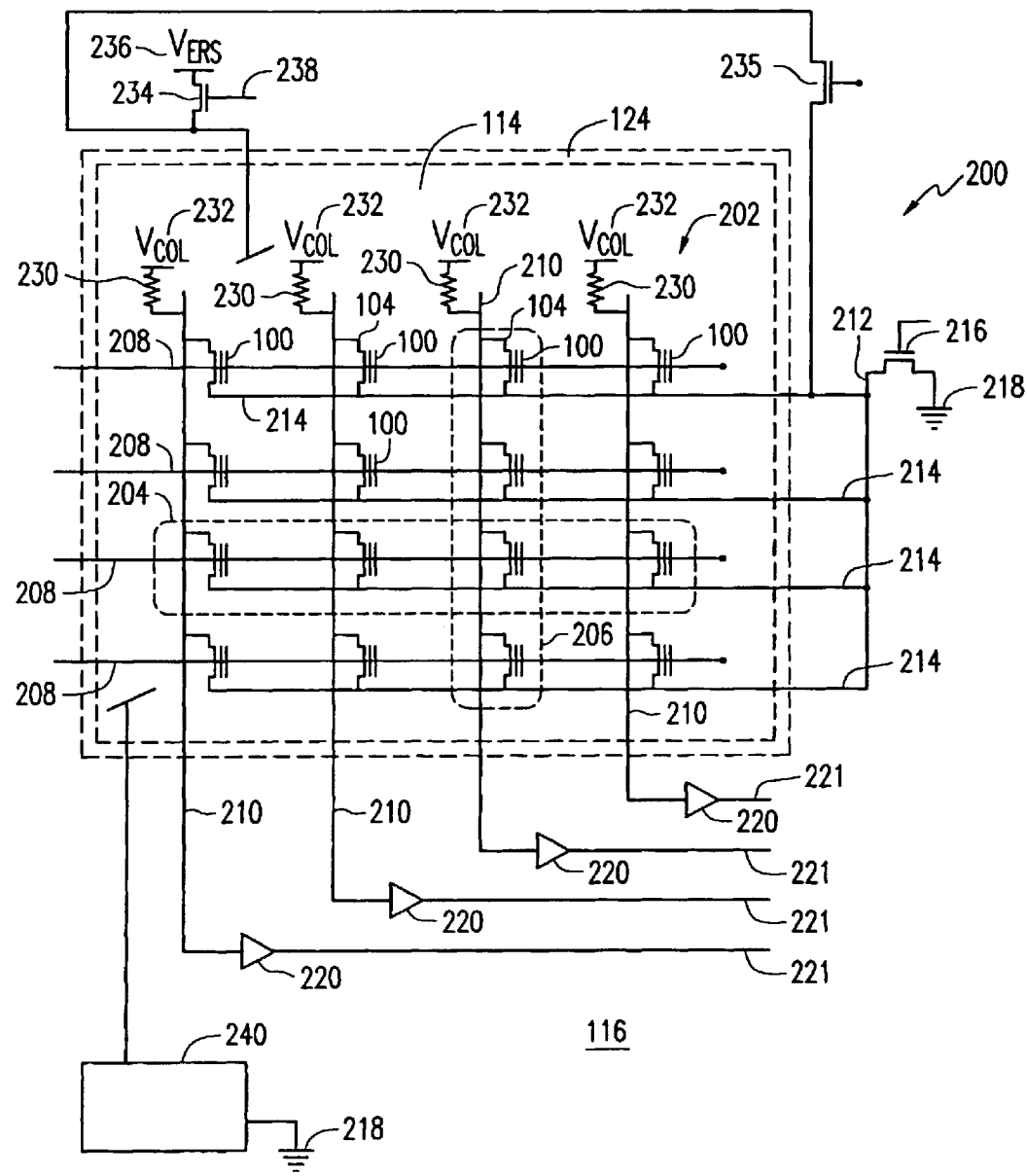
FIG. 2 shows an electrical schematic diagram of a portion of a flash memory device.

Also, as discussed above, in the FIG. 2 circuit threshold voltage Vth of the flash memory transistor 100 is referenced to the source 102 of the transistor 100, which is coupled to the array ground line 214. The sensing voltage (applied to the control gate 112 via the row line 208), however, is referenced to the p-well 114. Thus as the array ground line 214 voltage rises with respect to the p-well 114, the apparent voltage applied to the control gate 112 is reduced. The conductivity of the flash memory transistor 110 may diminish responsively, further slowing device response. In a further aspect of the invention the circuit of FIG. 3 avoids this problem.

In the operation of the FIG. 3 circuit, any rise that occurs in the potential of the array ground lines 214 during a read cycle is coupled to the p-well 114. The potential of the p-well 114 thus rises responsively. Therefore, both the sensing voltage applied on the row line 214 and the Vcol voltage 232 are mutually referenced to the common reference potential of the array ground lines 214 and the p-well 114. The apparent magnitude of the applied sensing voltage is thus not diminished by any rise of potential of the array ground lines 214. The result is improved operation of the flash memory device 300 during a read cycle.

Figure 1:
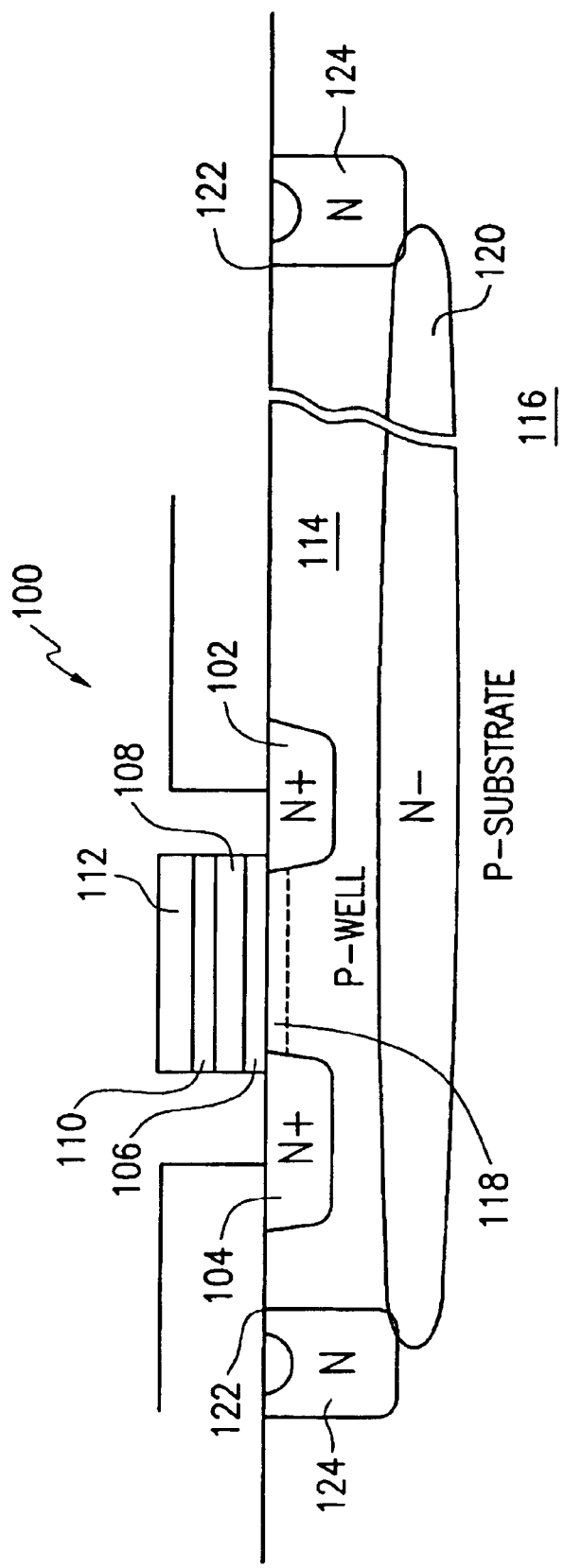
FIG. 1 shows a substrate cross-sectional view of the structure of a flash memory transistor.

FIG. 4 shows a substrate cross-sectional view of an exemplary flash memory transistor 100 and an exemplary switching device (coupling transistor) 400. The flash memory transistor and p-well 114 are as shown in FIG. 1. The coupling transistor 400 includes a source 404 of n-doped semiconductor material, a drain 402 of n-doped semiconductor material, an insulating layer 406, and a gate structure 408. The insulating layer is formed of, for example, silicon dioxide. The gate structure is formed of, for example, poly-crystalline silicon (poly) or metal, such as aluminum or copper.

A contact 410 region is fabricated in the p-well 114. The contact area includes P+ doped semiconductor, and is adapted to form an ohmic contact with a metallic link 412 disposed between the source 404 of the coupling transistor 400 and the contact area 410. A further metallic link 414 forms an ohmic contact with the drain 402 of the coupling transistor 400, and is disposed between the drain 402 and the array ground line 214.

Figure 5:
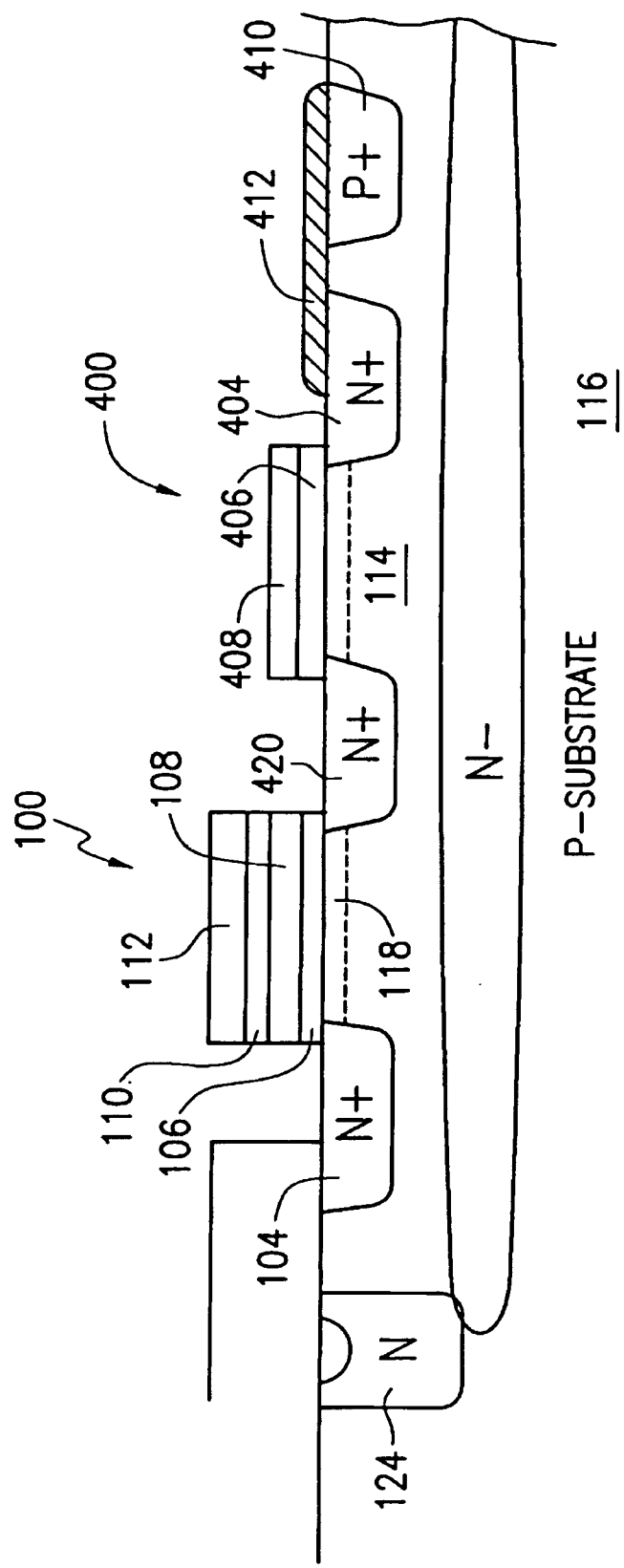
FIG. 5 shows a substrate cross-sectional view of the structure of a coupling transistor according to a further aspect of the invention.

FIG. 5 shows a substrate cross-sectional view of the exemplary flash memory transistor 100 and coupling transistor 400 of FIG. 4, including an alternate coupling arrangement. The source of the flash memory transistor 100 and the drain of the coupling transistor 400 are mutually formed of a single doped region 420 within the p-well 114. As in FIG. 4, a contact 410 area is fabricated in the p-well including P+ doped semiconductor, and is adapted to form an ohmic contact with a metallic link 412 disposed between the source 404 of the coupling transistor 400 and the contact area 410.

Figure 6:
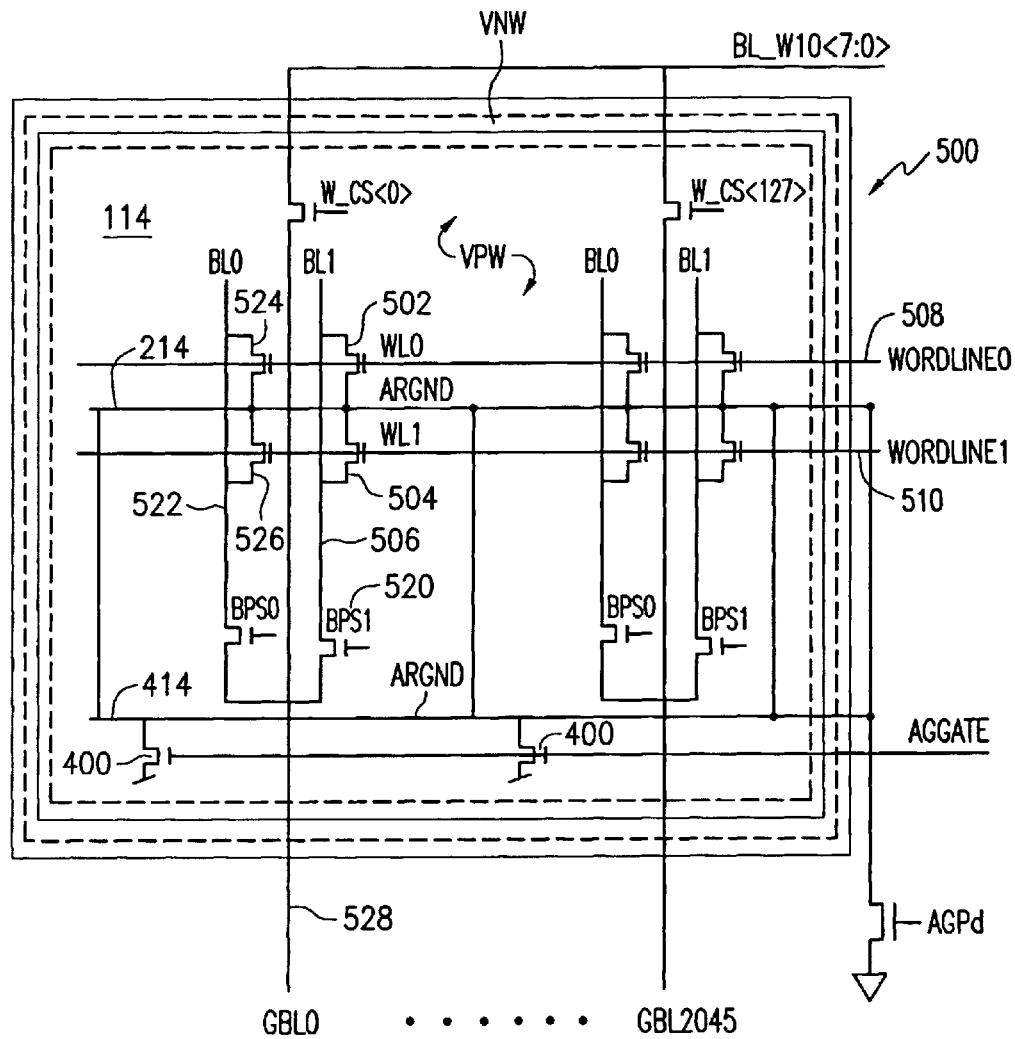
FIG. 6 an electrical schematic diagram of a portion of a flash memory device according to a further embodiment of the invention.

FIG. 6 shows a further aspect of the invention in which coupling transistors 400 are disposed to couple the array ground lines 214 to the p-well 114 of a divided bit line (DI-NOR) flash memory device 500. The DI-NOR flash memory device is fabricated within the p-well 114 and includes a plurality of flash memory transistors 100 arranged in rows and columns. A pair of flash memory transistors 502, 504 have their drains 104 mutually coupled to a respective local bit line 506 and their sources coupled to an array ground line 214. Each of the transistors 502, 504 which form a paired set of transistors have respective word lines 508 and 510 connected to their respective control gates 112. Local bit line 506 is, in turn, connected to the bit line access transistor 520 which couples the bit line 506, and the local bit line 522 from an adjacent pair 524, 526 of memory transistors, to a global bit line 528 and from there to a sense amplifier 220.

Figure 7:
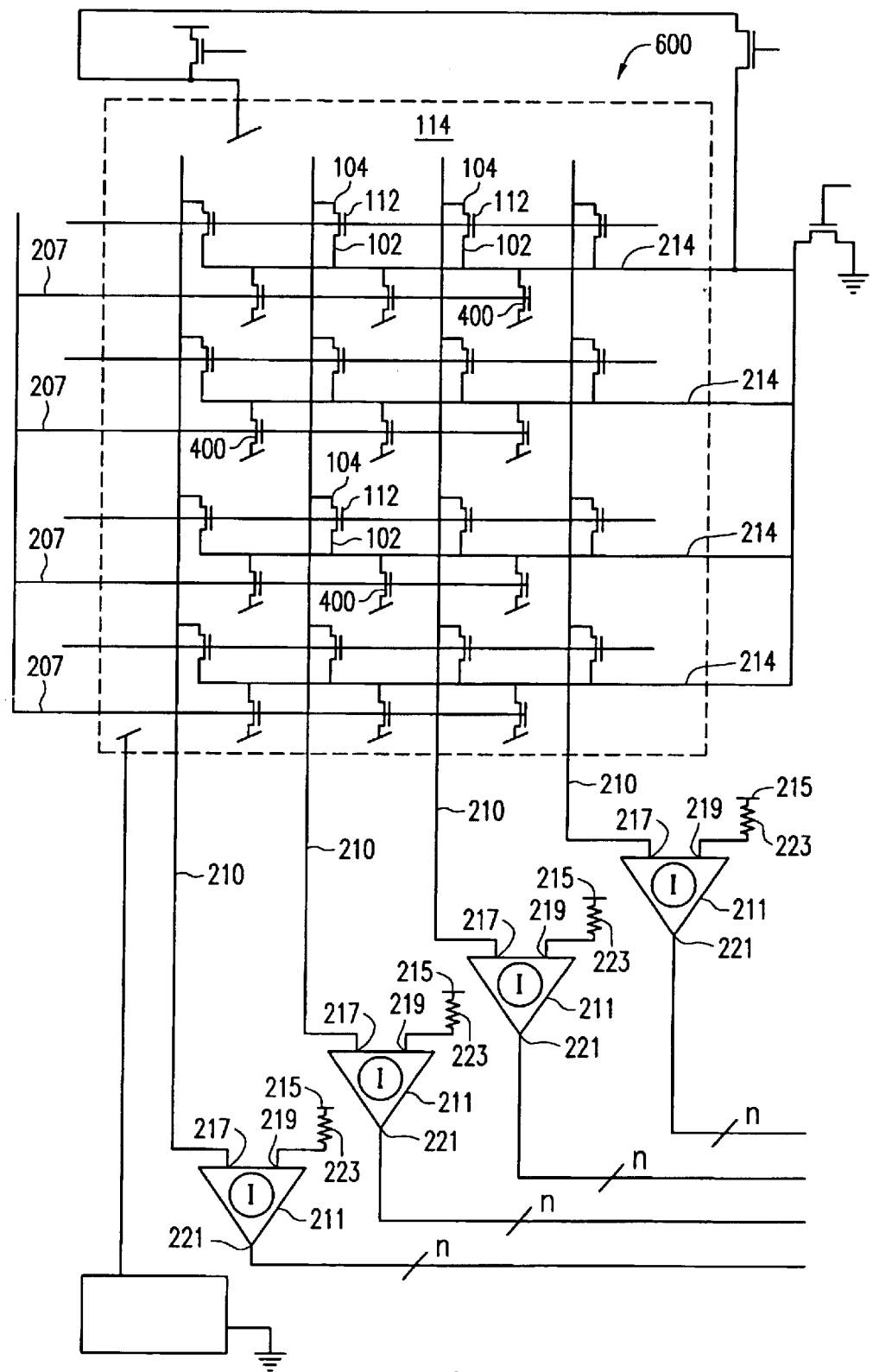
FIG. 7 an electrical schematic diagram of a portion of a flash memory device according to a further embodiment of the invention.

FIG. 7 shows a further aspect of the invention in which a plurality of distributed coupling transistors 400 are disposed between respective array ground lines 214 and the p-well 114 of a multi-bit per cell flash memory device 600. Rather than being limited to one of two binary states, a multi-bit memory cell transistor may be programmed into one of more than two (e.g., four) possible (quaternary) states. Each of the multi-bit memory cell flash memory transistors 400 has a drain 104 coupled to a respective one of a plurality of column lines 210, a source 102 coupled to a respective one of a plurality of array ground lines 214, and a control gate 112 coupled to a respective one of a plurality of row lines 207.

Each of the column lines 210 is coupled to a respective first input 217 of a respective one of a plurality of analog to digital converters (ADCs) 211. A respective second input 219 of each of the ADCs is connected through a respective pull-up resistor 223 to a source of a reference potential 215. As understood by one of skill in the art, a digital signal at a respective n-bit wide output 217 of the ADCs 211 during a read cycle is related to a programmed conductivity of the respective multi-bit flash memory transistor 400. Such operation of quaternary memory is known to one of skill in the art. The application, operation and benefits of the distributed array ground line switching devices 400 of the invention in the context of multi-bit memory is as described above with respect to binary memories.

The invention also includes a manufacturing process described here with reference to the structure of FIG. 4. The manufacturing process porduces a flash memory device including a plurality of switching devices such as n-mos transistors for coupling the array ground line to the p-well. The manufacturing process includes the steps of supplying and preparing a p-type substrate. As an example, a single crystal silicon ingot is grown from a p-doped silicon melt. A wafer is cut from the ingot to form a substrate 116, and a top surface of the waver is polished. Devices are formed on the substrate 116 by repeated masking, ion implantation, doping, and deposition steps. For example, a p-well 114 is formed in the substrate 116. To form the p-well, ion implantation is used to deposit an n-type region 120 and implantation or diffusion is used to deposit a further n-type trench region 124. Together the n-type region 120 and further n-type region 124 form an n-well with a p-well 114 disposed therewithin.

Now describing the manufacturing process with reference to FIG. 3, a plurality of flash memory transistors (e.g., 100) are fabricated within the p-well 114 disposed in a two dimensional array configuration 302. A plurality of column lines 210 are fabricated above the p-well 114 for coupling the respective drains 104 of rows 206 of the flash memory transistors 100. A plurality of row lines 208 are fabricated above the p-well 114 mutually coupling the respective control gates 112 of the flash memory transistors 100 of rows 204 of the flash memory transistors. A plurality of array ground lines 214 are fabricated mutually coupling the respective sources 102 of the rows 204 of the flash memory transistors 100 respectively to an array ground transistor 216 formed within the substrate 116.

Referring once again to FIG. 4, a plurality of contact regions 410 with a P+ dopin are formed at distributed locations throughout the p-well 114, and a plurality of n-mos transistors 400 are fabricated having respective drains 402 coupled to the array ground lines 214 and respective sources 404 coupled to the respective contact regions 410.

It should be noted that although the invention is described above with reference to use of a p-well 114 and associated n-channel memory transistors 110 as part of the memory array, the invention can be fabricated with complementary technology as well.

Figure 8:
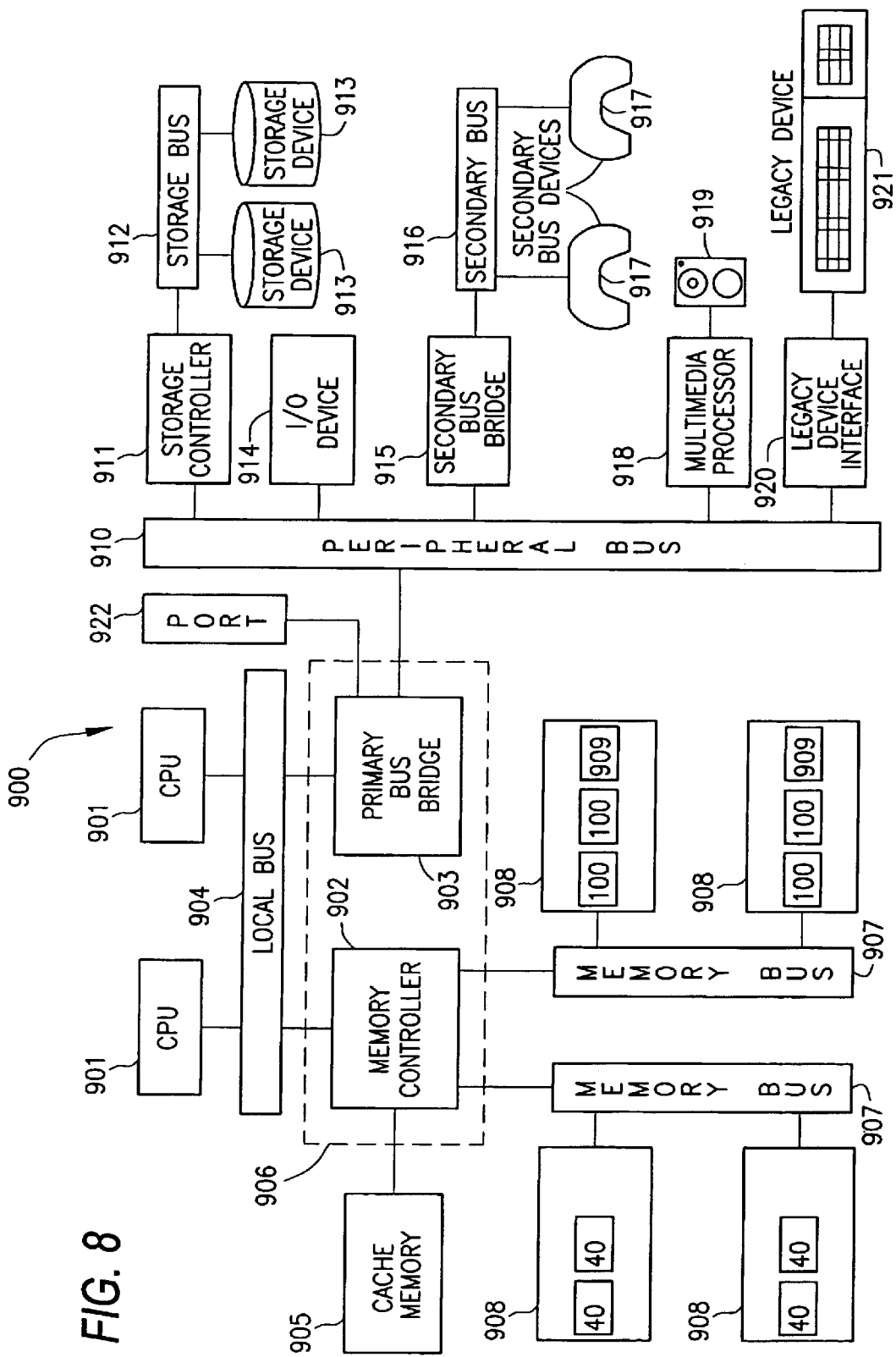
FIG. 8 shows the invention employed in a flash memory device which is part of a processor system.

FIG. 8 illustrates an exemplary processing system 900 which utilizes a memory device 40 according to the present invention. The processing system 900 includes one or more processors 901 coupled to a local bus 904. A memory controller 902 and a primary bus bridge 903 are also coupled the local bus 904. The processing system 900 may include multiple memory controllers 902 and/or multiple primary bus bridges 903. The memory controller 902 and the primary bus bridge 903 may be integrated as a single device 906.

The memory controller 902 is also coupled to one or more memory buses 907. Each memory bus accepts memory components 908, which include at least one memory device 40 contain the all resistive sensing system of the present invention. The memory components 908 may be a memory card or a memory module. Examples of memory modules include single inline memory modules (SIMMs) and dual inline memory modules (DIMMs). The memory components 908 may include one or more additional devices 909. For example, in a SIMM or DIMM, the additional device 909 might be a configuration memory, such as a serial presence detect (SPD) memory. The memory controller 902 may also be coupled to a cache memory 905. The cache memory 905 may be the only cache memory in the processing system. Alternatively, other devices, for example, processors 901 may also include cache memories, which may form a cache hierarchy with cache memory 905. If the processing system 900 include peripherals or controllers which are bus masters or which support direct memory access (DMA), the memory controller 902 may implement a cache coherency protocol. If the memory controller 902 is coupled to a plurality of memory buses 907, each memory bus 907 may be operated in parallel, or different address ranges may be mapped to different memory buses 907.

The primary bus bridge 903 is coupled to at least one peripheral bus 910. Various devices, such as peripherals or additional bus bridges may be coupled to the peripheral bus 910. These devices may include a storage controller 911, an miscellaneous I/O device 914, a secondary bus bridge 915, a multimedia processor 918, and an legacy device interface 920. The primary bus bridge 903 may also coupled to one or more special purpose high speed ports 922. In a personal computer, for example, the special purpose port might be the Accelerated Graphics Port (AGP), used to couple a high performance video card to the processing system 900.

The storage controller 911 couples one or more storage devices 913, via a storage bus 912, to the peripheral bus 910. For example, the storage controller 911 may be a SCSI controller and storage devices 913 may be SCSI discs. The I/O device 914 may be any sort of peripheral. For example, the I/O device 914 may be an local area network interface, such as an Ethernet card. The secondary bus bridge may be used to interface additional devices via another bus to the processing system. For example, the secondary bus bridge may be an universal serial port (USB) controller used to couple USB devices 917 via to the processing system 900. The multimedia processor 918 may be a sound card, a video capture card, or any other type of media interface, which may also be coupled to one additional devices such as speakers 919. The legacy device interface 920 is used to couple legacy devices, for example, older styled keyboards and mice, to the processing system 900.

The processing system 900 illustrated in FIG. 8 is only an exemplary processing system with which the invention may be used. While FIG. 8 illustrates a processing architecture especially suitable for a general purpose computer, such as a personal computer or a workstation, it should be recognized that well known modifications can be made to configure the processing system 900 to become more suitable for use in a variety of applications. For example, many electronic devices which require processing may be implemented using a simpler architecture which relies on a CPU 901 coupled to memory components 908 and/or memory devices 100. These electronic devices may include, but are not limited to audio/video processors and recorders, gaming consoles, digital television sets, wired or wireless telephones, navigation devices (including system based on the global positioning system (GPS) and/or inertial navigation), and digital cameras and/or recorders. The modifications may include, for example, elimination of unnecessary components, addition of specialized devices or circuits, and/or integration of a plurality of devices.

While preferred embodiments of the invention have been described in the illustrations above, it should be understood that these are exemplary of the invention and are not to be considered as limiting. Additions, deletions, substitutions, and other modifications can be made without departing from the spirit or scope of the present invention. Accordingly, the invention is not to be considered as limited by the foregoing description but is only limited by the scope of the appended claims.

What is claimed as new and desired to be protected by Letters Patent of the United States is:

1. A flash memory device comprising:
   a semiconductor substrate;
   a doped well within said semiconductor substrate;
   a word line;
   a bit line;
   an array ground line;
   a memory cell including a transistor having a drain coupled to said bit line, a control gate coupled to said word line, and a source coupled to said array ground line; and
   a plurality of coupling transistors spaced within said doped well, said coupling transistors each having a first terminal coupled to said array ground line and a second terminal coupled to said doped well, said coupling transistors adapted to switchingly electrically couple said array ground line to said doped well.

2. A flash memory device as defined in claim 1 comprising:
   a grounding transistor coupled between said array ground line and a source of ground potential.

3. A flash memory device as defined in claim 1 wherein said doped well is adapted to assume an electrical potential equal to one threshold voltage of said coupling transistors during a time interval when said coupling transistors are in a conductive state.

4. A flash memory device as defined in claim 1 wherein said doped well comprises:
   a p-well, said coupling transistors are n-type transistors, and said array ground line includes a metallic trace.

5. A flash memory device as defined in claim 1 wherein said plurality of coupling transistors are responsive to a control signal having a first state adapted to make said coupling transistors non-conductive during a device erasing time interval and a second state adapted to make said coupling transistors conductive during a device reading time interval.

6. A grounding circuit for a flash memory cell comprising:
   an array ground line coupled to a source terminal of a transistor of said flash memory cell; and
   a plurality of array ground transistors having respective drains coupled to said array ground line, said plurality of array ground transistors having respective drains coupled to a doped well in which said flash memory cell is disposed, and said plurality of array ground transistors having respective array ground transistor gates adapted to receive a grounding signal in response to which said plurality of array ground transistors form a respective plurality of conductive paths between said array ground line and said doped well.

7. A grounding circuit for a flash memory cell as defined in claim 6 further comprising:

an array ground control line mutually coupling said array ground transistor gates for communicating said grounding signal to said array ground transistor gates.

8. A grounding circuit for a flash memory cell as defined in claim 7, wherein said plurality of array ground transistors are spaced apart from one another within said doped well.

9. A processor system comprising:

at least one processor;

at least one flash memory device coupled to exchange data with said processor, said flash memory device comprising:

a circuit for coupling an array ground line of said flash memory device to a doped well of said flash memory device during a time interval when data is being read from a memory cell of said flash memory device, said circuit including a plurality of transistors coupled in parallel between said array ground line and said doped well.

10. A flash memory device comprising:

a plurality of flash memory transistors disposed within a doped well, each transistor of said plurality having a drain mutually coupled to a bit line and a respective source coupled to a respective array ground line;

a current sensing device including an analog to digital converter, said current sensing device having a first input coupled to a source of electric potential, a first output coupled to said bit line, and a second output port adapted to output a digital value corresponding to a current flowing through said first output;

a first switching device adapted to switchingly couple said array ground line to a source of substantially constant potential; and a second switching device adapted to switchingly couple said array ground line to said doped well.

11. A flash memory device as defined in claim 10 comprising:

a third switching device adapted to switchingly couple said doped well to said source of substantially constant potential.

12. A flash memory device as defined in claim 10 wherein said source of substantially constant potential comprises:

a source of ground potential.

13. A flash memory device as defined in claim 10 wherein said doped well comprises:

a p-well and wherein said plurality of flash memory transistors includes a plurality of n-type flash memory transistors, each of said flash memory transistors including a respective control gate and a respective floating gate.

14. A flash memory device comprising:

a plurality of flash memory transistors each having a respective source, drain, and control gate, said respective source connected to one of a plurality of array ground lines, said plurality of flash memory transistors disposed within a doped well; and means for switchingly coupling said plurality of array ground lines to said doped well during a read cycle of said flash memory device.

15. A flash memory device as defined in claim 14, wherein said doped well is disposed within a substrate and wherein said memory device comprises:

means for switchingly coupling said plurality of array ground lines to a region of said substrate outside of said doped well.

16. A flash memory device as defined in claim 15, wherein:

said doped well includes a p-type semiconductor well and said substrate includes a p-type semiconductor substrate; and wherein said memory device includes a region of n-type semiconductor material disposed between said doped well and said substrate.

17. A method of operating a flash memory device comprising:

switchingly electrically coupling an array ground line of said flash memory device containing a plurality of memory cells to a substrate portion of said flash memory device such that a first electrical potential of said substrate portion depends on a second electrical potential of said array ground line.

18. A method of manufacturing a flash memory device comprising:

forming a doped well in a semiconductor substrate; disposing a plurality of flash memory transistors in said doped well, each of said flash memory transistors having a respective flash transistor source terminal;

disposing a plurality of field effect coupling transistors in said doped well, each of said field effect coupling transistors having a coupling transistor source and a coupling transistor drain;

mutually coupling said flash transistor source terminals to an array ground node of said flash memory device;

mutually coupling said coupling transistor source terminals to said array ground node; and switchingly coupling each one of said plurality of coupling transistor drains to said doped well, such that said plurality of coupling transistors are adapted to connect said array ground node to said doped well during a read cycle of said flash memory device.

19. A method of setting an electrical potential of a flash memory source of a flash memory transistor comprising:

coupling said flash memory source to an array ground node;

switchingly coupling said array ground node to a source of ground potential through an array ground transistor;

switchingly coupling said array ground node to a p-well disposed within a semiconductor substrate through a coupling transistor, said flash memory transistor disposed within said p-well; and making said array ground transistor and said coupling transistor conductive during a read cycle time interval of said flash memory transistor.

\* \* \* \* \*